United States Patent
Luan et al.

(10) Patent No.: US 9,202,960 B2
(45) Date of Patent: Dec. 1, 2015

(54) LEAKAGE PATHWAY LAYER FOR SOLAR CELL

(75) Inventors: Andy Luan, Palo Alto, CA (US); David Smith, Campbell, CA (US); Peter Cousins, Menlo Park, CA (US); Sheng Sun, Foster City, CA (US)

(73) Assignee: SunPower Corporation, San Jose, CA (US)

( * ) Notice: Subject to any disclaimer, the term of this patent is extended or adjusted under 35 U.S.C. 154(b) by 812 days.

(21) Appl. No.: 12/750,320

(22) Filed: Mar. 30, 2010

(65) Prior Publication Data
US 2011/0240105 A1 Oct. 6, 2011

(51) Int. Cl.
*H01L 31/042* (2014.01)
*H01L 31/068* (2012.01)
*H01L 31/0216* (2014.01)

(52) U.S. Cl.
CPC ...... *H01L 31/0682* (2013.01); *H01L 31/02167* (2013.01); *Y02E 10/547* (2013.01)

(58) Field of Classification Search
CPC ............. H01L 31/02167; H01L 31/0682; Y02E 10/547
USPC ........................ 136/255, 256; 438/72
See application file for complete search history.

(56) References Cited

U.S. PATENT DOCUMENTS

| | | | |
|---|---|---|---|
| 5,030,295 A * | 7/1991 | Swanson et al. | 136/256 |
| 7,554,031 B2 * | 6/2009 | Swanson et al. | 136/261 |
| 7,737,357 B2 * | 6/2010 | Cousins | 136/261 |
| 2002/0070416 A1 | 6/2002 | Morse et al. | |
| 2003/0010375 A1 | 1/2003 | Dinwoodie | |
| 2003/0234417 A1 | 12/2003 | Raaijmakers et al. | |
| 2007/0256728 A1 * | 11/2007 | Cousins | 136/252 |
| 2008/0035198 A1 | 2/2008 | Teppe et al. | |
| 2009/0199901 A1 * | 8/2009 | Trassl et al. | 136/261 |
| 2011/0240114 A1 * | 10/2011 | Stewart et al. | 136/256 |
| 2012/0024368 A1 * | 2/2012 | Sauar et al. | 136/256 |

FOREIGN PATENT DOCUMENTS

WO   WO 2008/115814 A2 * 9/2008 .......... H01L 31/0224

OTHER PUBLICATIONS

International Search Report and Written Opinion from PCT/US2011/022728 mailed, Sep. 21, 2011, 10 pgs.
International Preliminary Report on Patentability from PCT/US2011/022728 mailed Oct. 11, 2012, 8 pgs.

* cited by examiner

*Primary Examiner* — Devina Pillay
(74) *Attorney, Agent, or Firm* — Blakely Sokoloff Taylor Zafman LLP

(57) ABSTRACT

Leakage pathway layers for solar cells and methods of forming leakage pathway layers for solar cells are described.

18 Claims, 4 Drawing Sheets

LEAKAGE PATHWAY LAYER FOR SOLAR CELL

The invention described herein was made with Governmental support under contract number DE-FC36-07GO17043 awarded by the United States Department of Energy. The Government may have certain rights in the invention.

TECHNICAL FIELD

Embodiments of the present invention are in the field of renewable energy and, in particular, leakage pathway layers for solar cells and methods of forming leakage pathway layers for solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of the substrate creates electron and hole pairs in the bulk of the substrate, which migrate to p-doped and n-doped regions in the substrate, thereby generating a voltage differential between the doped regions. The doped regions are connected to metal contacts on the solar cell to direct an electrical current from the cell to an external circuit coupled thereto.

Efficiency is an important characteristic of a solar cell as it is directly related to the solar cell's capability to generate power. Accordingly, techniques for increasing the efficiency of solar cells are generally desirable. Embodiments of the present invention allow for increased solar cell efficiency by providing processes for fabricating novel solar cell structures.

DETAILED DESCRIPTION

Figure 1:
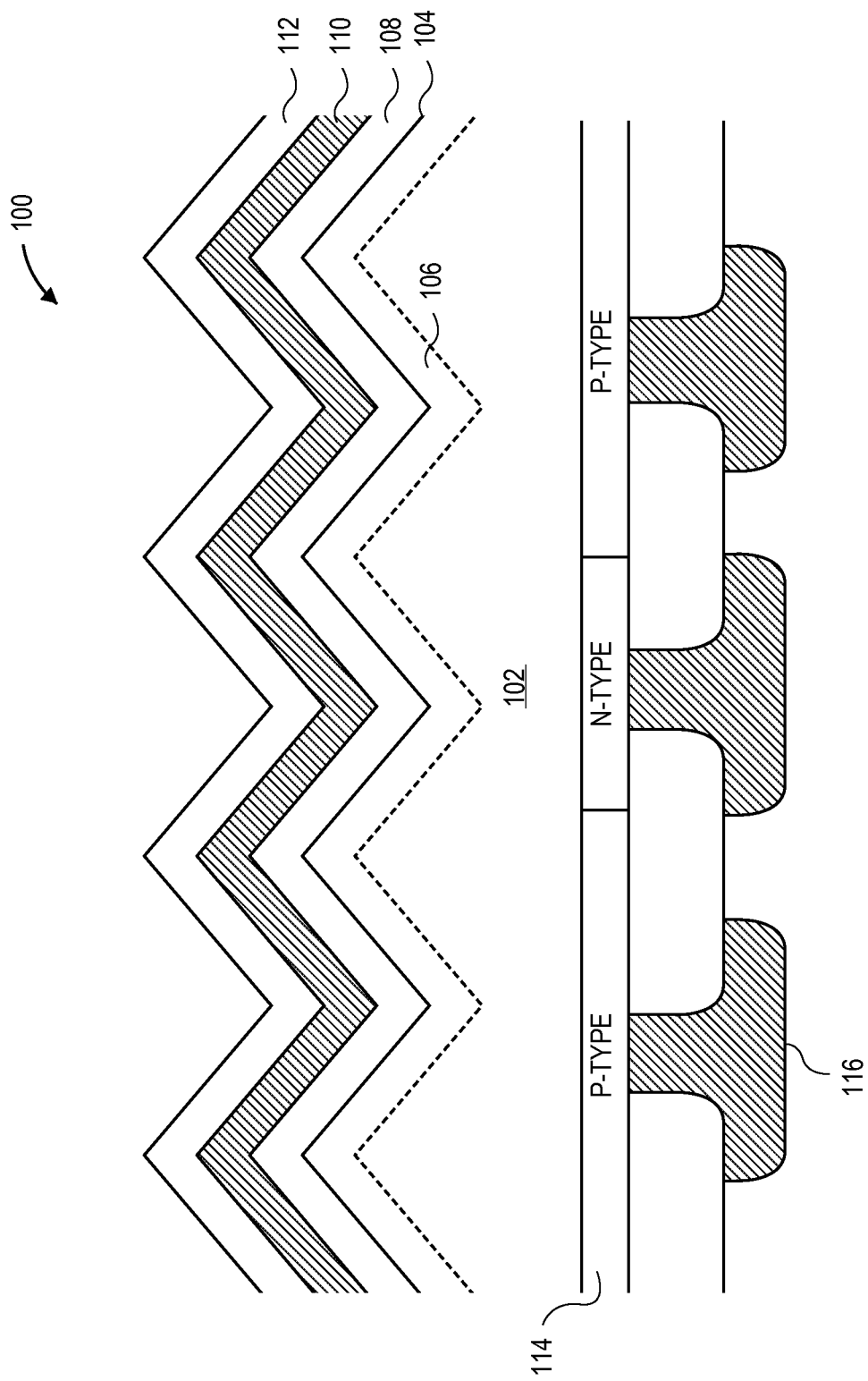
FIG. 1 illustrates a cross-sectional view of a back-contact solar cell including a leakage pathway layer, in accordance with an embodiment of the present invention.

Leakage pathway layers for solar cells and methods of forming leakage pathway layers for solar cells are described herein. In the following description, numerous specific details are set forth, such as specific process flow operations, in order to provide a thorough understanding of embodiments of the present invention. It will be apparent to one skilled in the art that embodiments of the present invention may be practiced without these specific details. In other instances, well-known fabrication techniques, such as lithographic techniques, are not described in detail in order to not unnecessarily obscure embodiments of the present invention. Furthermore, it is to be understood that the various embodiments shown in the figures are illustrative representations and are not necessarily drawn to scale.

Disclosed herein are methods of forming leakage pathway layers for solar cells. In one embodiment, a method of fabricating a solar cell includes forming a dielectric layer above a substrate, the dielectric layer having a first thickness. The dielectric layer is thinned to a second thickness, less than the first thickness. A leakage pathway layer is formed above the dielectric layer having the second thickness. An anti-reflective coating layer is formed above the leakage pathway layer. In one embodiment, a method of fabricating a solar cell includes forming a dielectric layer above a substrate, the dielectric layer having a first thickness. The dielectric layer is thinned to a second thickness, less than the first thickness. An anti-reflective coating layer is formed above the dielectric layer having the second thickness.

Also disclosed herein are leakage pathway layers for solar cells and solar cells including leakage pathway layers. In one embodiment, a solar cell includes a dielectric layer disposed above a substrate. A leakage pathway layer is disposed above the dielectric layer, the leakage pathway layer including a layer of phosphorus- or boron-doped silicon with a morphology such as, but not limited to, amorphous, nano-crystalline, and fine-grained. An anti-reflective coating layer is disposed above the leakage pathway layer.

In accordance with at least some embodiments of the present invention, solar cell efficiency is improved by including a leakage pathway layer in the solar cell itself. For example, front surface passivation may be key to high efficiency in back contact, and even in concentrating back-contact, solar cells based on silicon substrates. However, in one embodiment, the accumulation of charges in the front surface passivation results in degradation of cell efficiency. In accordance with an embodiment of the present invention, an approach to prevent the accumulation of such charges includes providing a layer of a conductive pathway film, or a leakage pathway layer, at or near an anti-reflective coating layer on the passivation side of the solar cell. In a specific embodiment, the conductive film is a layer of phosphorus- or boron-doped silicon.

The layer of phosphorus- or boron-doped silicon may improve the reliability of cells by providing a pathway for charges to leak away from the heart of the solar cell. In an embodiment, such a layer is applied to the back of a solar cell in cases where a similar passivation layer or stack of layers is also included on the back side of the solar cell. In accordance with an embodiment of the present invention, leakage pathway layers described herein reduce efficiency loss in solar cells by reducing effects of polarization and/or by increasing stability of the cell against ultra-violet radiation damage. It is noted that although many of the embodiments described herein are in association with back-contact solar cells, other solar cells (e.g., bifacial solar cells) are also contemplated within the scope of at least some embodiments of the present invention.

In an aspect of the present invention, a back-contact solar cell may include a leakage pathway layer. For example, FIG. 1 illustrates a cross-sectional view of a back-contact solar cell including a leakage pathway layer, in accordance with an embodiment of the present invention.

Referring to FIG. 1, a solar cell 100 includes a dielectric layer 108 disposed above a substrate 102. A leakage pathway layer 110 is disposed above dielectric layer 108. An anti-reflective coating layer 112 is disposed above leakage pathway layer 110. In an embodiment, dielectric layer 108 is disposed directly on substrate 102, leakage pathway layer 110 is disposed directly on dielectric layer 108, and anti-reflective coating layer 112 is disposed directly on leakage pathway layer 110. In one embodiment, dielectric layer 108 has a thickness approximately in the range of 35-45 Angstroms. In one embodiment, anti-reflective coating layer 112 has a thickness approximately in the range of 70-80 nanometers.

In accordance with an embodiment of the present invention, leakage pathway layer 110 includes a layer of phosphorus- or boron-doped silicon with a morphology such as, but not limited to, amorphous, nano-crystalline, or fine-grained. In one embodiment, the layer of phosphorus- or boron-doped silicon has a thickness less than 10 nanometers. In a specific embodiment, the layer of phosphorus- or boron-doped silicon has a thickness of approximately 5 nanometers.

In accordance with an embodiment of the present invention, substrate 102 is composed of a bulk silicon substrate. In one embodiment, the bulk silicon substrate is doped with N-type dopants. In an embodiment, substrate 102 includes a concentrated doped region 106, as depicted in FIG. 1, to accommodate field effects. In an embodiment, substrate 102 has a textured surface 104, as is also depicted in FIG. 1.

In accordance with an embodiment of the present invention, solar cell 100 is a back-contact solar cell, and dielectric layer 108 is disposed on a light-receiving surface of substrate 102. Referring again to FIG. 1, the back contact solar cell includes P-type and N-type active regions 114. Conductive contacts 116, such as metal contacts, are connected to active regions 114 and are separated from one another by isolation regions, which may be composed of a dielectric material.

Figure 2:
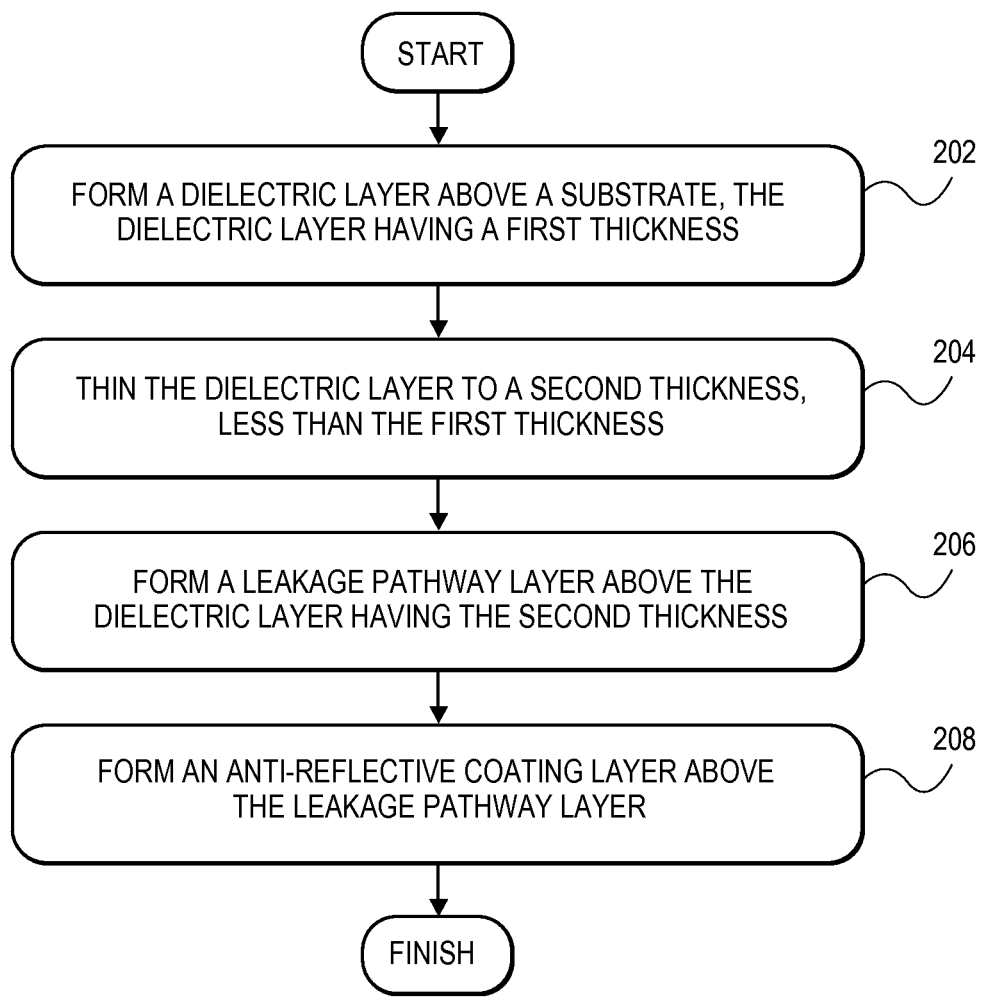
FIG. 2 illustrates a flowchart representing operations in a method of fabricating a solar cell including a leakage pathway layer, in accordance with an embodiment of the present invention.

A solar cell may be fabricated to include a leakage pathway layer. For example, FIG. 2 illustrates a flowchart 200 representing operations in a method of fabricating a solar cell including a leakage pathway layer, in accordance with an embodiment of the present invention. FIGS. 3A-3D illustrate cross-sectional views of various stages in the fabrication of a solar cell including a leakage pathway layer, corresponding to operations of flowchart 200, in accordance with an embodiment of the present invention.

Figure 3A:
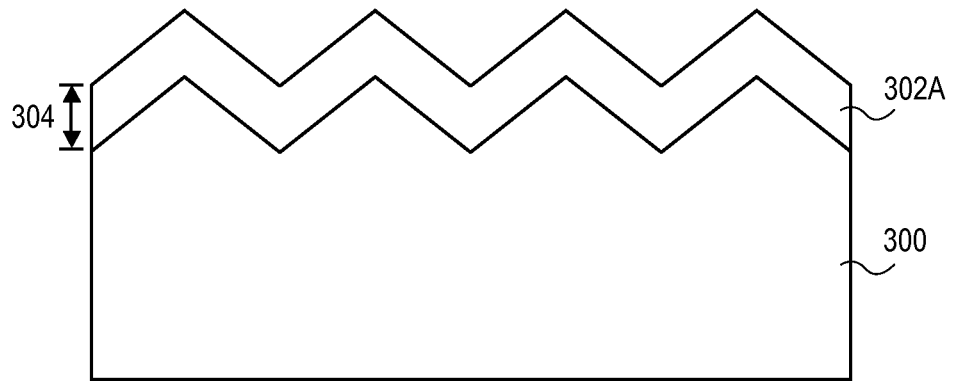
FIG. 3A illustrates a cross-sectional view of a stage in the fabrication of a solar cell including a leakage pathway layer, corresponding to operation 202 of the flowchart of FIG. 2, in accordance with an embodiment of the present invention.

Referring to operation 202 of flowchart 200, and corresponding FIG. 3A, a method of fabricating a solar cell includes forming a dielectric layer 302A above a substrate 300. Dielectric layer 302A has a first thickness 304. In accordance with an embodiment of the present invention, the solar cell is a back-contact solar cell, and forming dielectric layer 302A above substrate 300 includes forming dielectric layer 302A on a light-receiving surface of substrate 300.

Figure 3B:
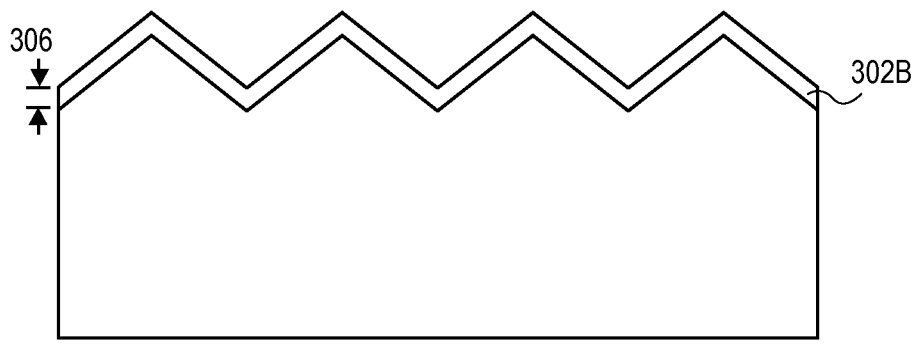
FIG. 3B illustrates a cross-sectional view of a stage in the fabrication of a solar cell including a leakage pathway layer, corresponding to operation 204 of the flowchart of FIG. 2, in accordance with an embodiment of the present invention.

Referring to operation 204 of flowchart 200, and corresponding FIG. 3B, the method of fabricating a solar cell further includes thinning dielectric layer 302A to a second thickness 306. Second thickness 306 is less than first thickness 304, providing dielectric layer 302B.

In accordance with an embodiment of the present invention, dielectric layer 302A is composed of silicon dioxide, and thinning dielectric layer 302A to second thickness 306 (to provide dielectric layer 302B) includes etching dielectric layer 302A with an etchant such as, but not limited to, an aqueous solution of hydrofluoric acid or a $CF_4$, $NF_3$, CxFy or $SF_6$-based plasma. In one embodiment, thinning dielectric layer 302A to second thickness 306, less than first thickness 304, includes thinning dielectric layer 302A from first thickness 304 approximately in the range of 65-75 Angstroms to second thickness 306 approximately in the range of 35-45 Angstroms. In one embodiment, a $CF_4$, $NF_3$, CxFy or $SF_6$-based plasma is used, and thinning dielectric layer 302A to second thickness 306 includes etching dielectric layer 302A in the same process chamber in which dielectric layer 302A is formed, without removing substrate 300 between the forming and the thinning of dielectric layer 302A. 10. In an embodiment, thinning dielectric layer 302A to second thickness 306 includes reducing or eliminating a number of surface defects in dielectric layer 302A. For example, in a specific embodiment, dielectric layer 302A is hygroscopic and picks up unwanted moisture during or after the deposition of dielectric layer 302A. Upon thinning dielectric layer 302A to provide dielectric layer 302B, defects or contaminants may be removed from during the thinning process. In accordance with an embodiment of the present invention, thinning the dielectric layer 302A to the second thickness 306 enables an electric field effect on a solar-receiving surface of the solar cell, the electric field effect comprising a band-bending into substrate 300.

Figure 3C:
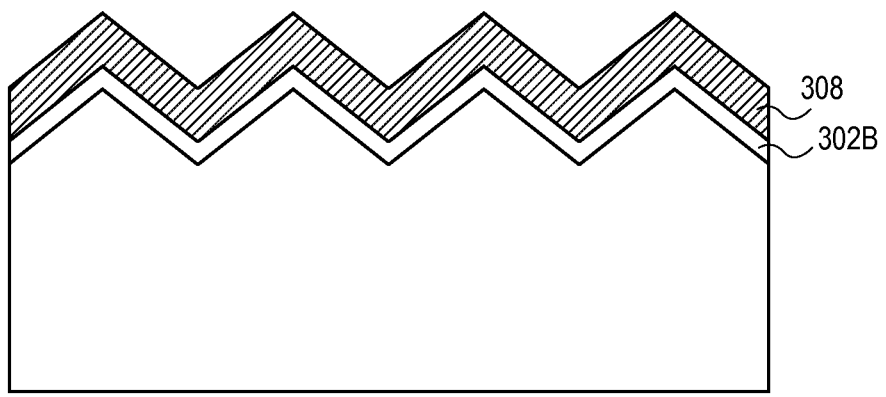
FIG. 3C illustrates a cross-sectional view of a stage in the fabrication of a solar cell including a leakage pathway layer, corresponding to operation 206 of the flowchart of FIG. 2, in accordance with an embodiment of the present invention.

Referring to operation 206 of flowchart 200, and corresponding FIG. 3C, the method of fabricating a solar cell further includes forming a leakage pathway layer 308 above dielectric layer 302B having second thickness 306.

In accordance with an embodiment of the present invention, forming leakage pathway layer 308 includes forming a layer of phosphorus- or boron-doped silicon with a morphology such as, but not limited to, amorphous, nano-crystalline, or fine-grained. In one embodiment, forming the layer of phosphorus- or boron-doped silicon includes depositing the layer to have a thickness less than 10 nanometers in a plasma-enhanced chemical vapor deposition chamber. In a specific embodiment, depositing the layer to have a thickness less than 10 nanometers includes depositing to a thickness of approximately 5 nanometers.

Figure 3D:
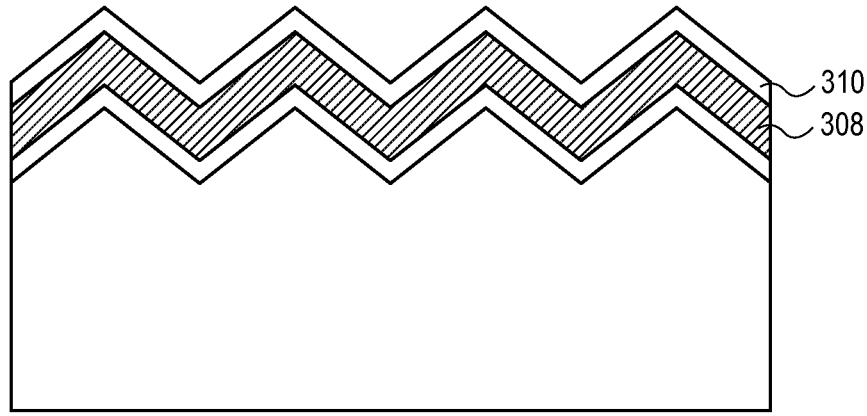
FIG. 3D illustrates a cross-sectional view of a stage in the fabrication of a solar cell including a leakage pathway layer, corresponding to operation 208 of the flowchart of FIG. 2, in accordance with an embodiment of the present invention.

Referring to operation 208 of flowchart 200, and corresponding FIG. 3D, the method of fabricating a solar cell further includes forming an anti-reflective coating layer 310 above leakage pathway layer 308.

In accordance with an embodiment of the present invention, forming anti-reflective coating layer 310 above leakage pathway layer 308 includes forming a layer of silicon nitride with a thickness approximately in the range of 70-80 nanometers. In an embodiment, forming dielectric layer 302A above substrate 300 includes forming dielectric layer 302A directly on substrate 300, forming leakage pathway layer 308 above dielectric layer 302B includes forming leakage pathway layer 308 directly on dielectric layer 302B, and forming anti-reflective coating layer 310 above leakage pathway layer 308 includes forming anti-reflective coating layer 310 directly on leakage pathway layer 308.

Figure 4:
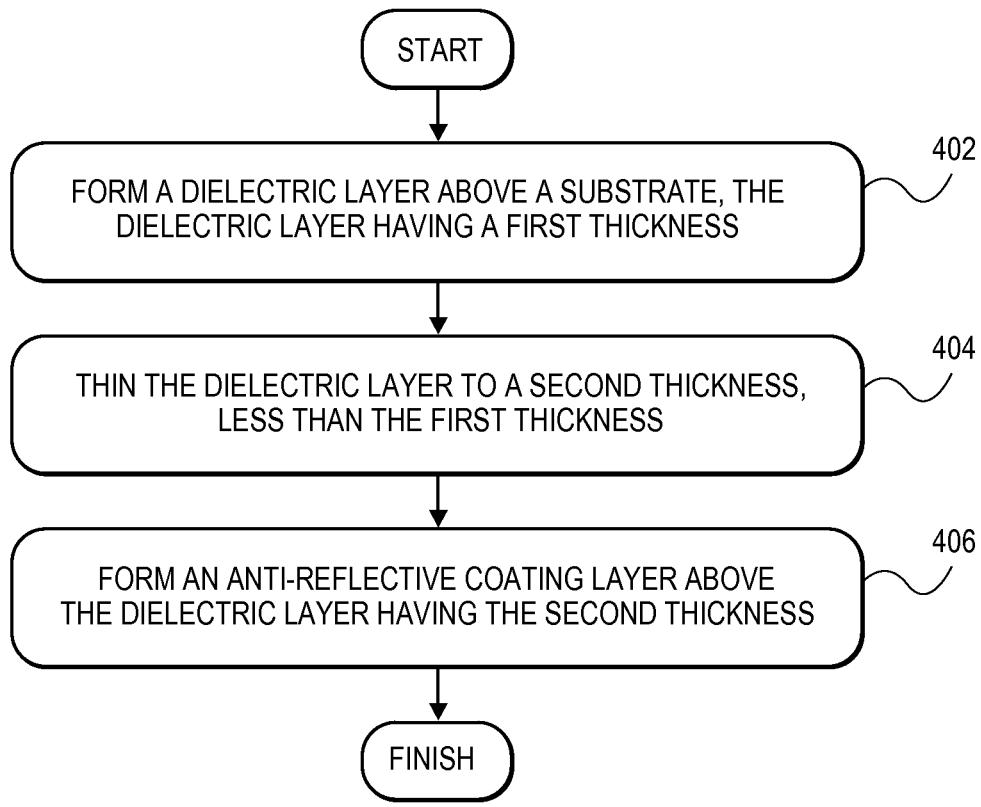
FIG. 4 illustrates a flowchart representing operations in a method of fabricating a solar cell including a thin dielectric layer but not a leakage pathway layer, in accordance with an embodiment of the present invention.

In another aspect of the present invention, a solar cell may be fabricated by thinning a dielectric layer, but need not necessarily include a leakage pathway layer. For example, FIG. 4 illustrates a flowchart 400 representing operations in a method of fabricating a solar cell including a thin dielectric layer but not a leakage pathway layer, in accordance with an embodiment of the present invention.

Referring to operation 402 of flowchart 400, a method of fabricating a solar cell includes forming a dielectric layer above a substrate, the dielectric layer having a first thickness. Referring to operation 404 of flowchart 400, the method of fabricating a solar cell also includes thinning the dielectric layer to a second thickness, less than the first thickness. Referring to operation 406 of flowchart 400, the method of fabricating a solar cell also includes forming an anti-reflective coating layer above the dielectric layer having the second thickness.

In accordance with an embodiment of the present invention, the anti-reflective coating layer is formed directly on the dielectric layer having the second thickness. In an embodiment, thinning the dielectric layer to the second thickness, less than the first thickness, includes thinning the dielectric layer to a thickness suitable to force direct tunneling from the anti-reflective coating layer, through the dielectric layer, to the substrate. In an embodiment, forming the dielectric layer above the substrate includes forming a doped dielectric layer above the substrate, and the method further includes driving dopants from the doped dielectric layer into the substrate to provide a depleted dielectric layer, wherein thinning the dielectric layer to the second thickness includes thinning the depleted dielectric layer. In one embodiment, thinning the dielectric layer to the second thickness enables an electric field effect on a solar-receiving surface of the solar cell, the electric field effect comprising a band-bending into the substrate.

Thus, leakage pathway layers for solar cells and methods of forming leakage pathway layers for solar cells have been disclosed. In accordance with an embodiment of the present invention, a method of fabricating a solar cell includes forming a dielectric layer above a substrate, the dielectric layer having a first thickness. The method also includes thinning the dielectric layer to a second thickness, less than the first thickness. The method also includes forming a leakage pathway layer above the dielectric layer having the second thickness. The method also includes forming an anti-reflective coating layer above the leakage pathway layer. In one embodiment, forming the leakage pathway layer includes forming a layer of phosphorus- or boron-doped silicon with a morphology such as, but not limited to, amorphous, nano-crystalline, or fine-grained.

What is claimed is:

1. A solar cell, comprising:
a dielectric layer disposed above an N-type silicon substrate;
a leakage pathway layer disposed above the dielectric layer, the leakage pathway layer comprising a layer of N-type silicon having a thickness less than 10 nanometers; and
an anti-reflective coating layer disposed above the leakage pathway layer.

2. The solar cell of claim 1, wherein the layer of N-type silicon has a thickness of approximately 5 nanometers.

3. The solar cell of claim 1, wherein the solar cell is a back-contact solar cell, and the dielectric layer is disposed on a light-receiving surface of the substrate.

4. The solar cell of claim 1, wherein the dielectric layer is disposed directly on the substrate, wherein the leakage pathway layer is disposed directly on the dielectric layer, and wherein the anti-reflective coating layer is disposed directly on the leakage pathway layer.

5. The solar cell of claim 1, wherein the dielectric layer has a thickness approximately in the range of 35-45 Angstroms.

6. The solar cell of claim 1, wherein the anti-reflective coating layer has a thickness approximately in the range of 70-80 nanometers.

7. The solar cell of claim 1, wherein the dielectric layer is for enabling an electric field effect on a solar-receiving surface of the solar cell, the electric field effect comprising a band bending into the substrate.

8. The solar cell of claim 1, wherein the dielectric layer is a silicon dioxide dielectric layer.

9. The solar cell of claim 1, wherein the layer of N-type silicon is a layer of phosphorus-doped silicon.

10. The solar cell of claim 1, wherein the layer of N-type silicon has a morphology selected from the group consisting of amorphous, nano-crystalline, and fine-grained.

11. The solar cell of claim 1, wherein the layer of N-type silicon has a morphology selected from the group consisting of nano-crystalline and fine-grained.

12. A solar cell, comprising:
a silicon dioxide dielectric layer disposed on an N-type silicon substrate;
a leakage pathway layer disposed on the silicon dioxide dielectric layer, the leakage pathway layer comprising a layer of phosphorus-doped silicon with a morphology selected from the group consisting of amorphous, nano-crystalline, and fine-grained, wherein the layer of phosphorus-doped silicon has a thickness less than 10 nanometers; and
an anti-reflective coating layer disposed on the leakage pathway layer.

13. The solar cell of claim 12, wherein the layer of phosphorus-doped silicon has a thickness of approximately 5 nanometers.

14. The solar cell of claim 12, wherein the solar cell is a back-contact solar cell, and the silicon dioxide dielectric layer is disposed on a light-receiving surface of the substrate.

15. The solar cell of claim 12, wherein the silicon dioxide dielectric layer has a thickness approximately in the range of 35-45 Angstroms.

16. The solar cell of claim 12, wherein the anti-reflective coating layer has a thickness approximately in the range of 70-80 nanometers.

17. The solar cell of claim 12, wherein the silicon dioxide dielectric layer is for enabling an electric field effect on a solar-receiving surface of the solar cell, the electric field effect comprising a band bending into the substrate.

18. The solar cell of claim 12, wherein the layer of phosphorus-doped silicon has a morphology selected from the group consisting of nano-crystalline and fine-grained.

* * * * *